United States Patent [19]

Lieske et al.

[11] Patent Number: 4,841,525

[45] Date of Patent: Jun. 20, 1989

[54] METHOD AND ARRANGEMENT FOR TESTING MEGA-BIT MEMORY MODULES WITH ARBITRARY TEST PATTERNS IN A MULTI-BIT TEST MODE

[75] Inventors: Normen Lieske, Augsburg; Werner Seichter, Unterföhring, both of Fed. Rep. of Germany

[73] Assignee: Siemens Aktiengesellschaft, Berlin and Munich, Fed. Rep. of Germany

[21] Appl. No.: 104,155

[22] Filed: Oct. 5, 1987

[30] Foreign Application Priority Data

Oct. 8, 1986 [DE] Fed. Rep. of Germany ....... 3634352

[51] Int. Cl.$^4$ ............................................. G01R 31/28
[52] U.S. Cl. ......................................... 371/21; 371/24
[58] Field of Search ................. 371/21, 24; 324/73 R, 324/73 AT

[56] References Cited

U.S. PATENT DOCUMENTS

| | | | |
|---|---|---|---|
| 4,195,770 | 4/1980 | Benton et al. | 371/21 |
| 4,319,355 | 3/1982 | Mollier | 371/21 |
| 4,414,665 | 11/1983 | Kimura et al. | 371/21 |
| 4,541,090 | 9/1985 | Shiragasawa | 371/21 |
| 4,667,330 | 5/1987 | Kumagai | 371/71 |
| 4,752,929 | 6/1988 | Kantz | 371/21 |

Primary Examiner—Charles E. Atkinson

[57] ABSTRACT

For testing memory modules of the mega-bit generation in the multi-bit test mode with arbitrary test patterns, whereby m cells of the cell field are simultaneously tested, at least one m-dimensional test word is generated in test word registers additionally integrated in the memory module MBS, with at least one test word being subsequently mapped onto the cells of an m-dimensional cell group or of a plurality of cell groups. Simultaneously, the test word or words are supplied to a comparison logic for comparing these to the test words upon readout of the test contents of a cell group and generating a good or bad signal for indicating the result of this inverse mapping, dependent on the comparison.

6 Claims, 1 Drawing Sheet

METHOD AND ARRANGEMENT FOR TESTING MEGA-BIT MEMORY MODULES WITH ARBITRARY TEST PATTERNS IN A MULTI-BIT TEST MODE

BACKGROUND OF THE INVENTION

The invention is directed to a method for testing memory modules of the mega-bit generation with arbitrary test patterns in a multi-bit test mode, and to an arrangement for the implementation of this method.

In order to keep testing times short, memory modules of the mega-bit generation comprise a multi-bit test mode in which test information signasl are read-in at the data input of the memory module and simultaneously imaged on a plurality of cells of the cell field. For example, 1M (words)×1 (bit) -organized memory modules are tested as though they were organized with m cells, such as 256K×4, 128K×8, 64K×16, etc. so that 4, 8, 16 cells, etc. are simultaneously tested with a 1-bit datum per applied memory address.

The data actually written into the respectively m cells depend on the module design of the individual manufacturers. The cell data written-in are the m-dimensional result of the allocation of the one-bit test datum to the individual cells of a cell group described by the m-dimensional function $$f(DE) = \{DE\}_{1,\ldots,m} \text{ with } DE \in \{0, 1\}$$

in which DE represents a data information signal that is read into the mega-bit memory module.

The inverse allocation $$f^{-1}(\{DA\}_{1,\ldots,m}) = DA \text{ with } DA \in \{0, 1\},$$

is produced upon read-out of the cell contents of a cell group, so that the original test datum again appears at the data output of the memory module having error-free memory cells. DA represents a data information signal that is read out of the mega-bit memory module.

When the negated test datum is written in, the cell data are written into the cells of a cell group negated, so that the negated bit pattern resides in the cell group overall, in comparison to the bit pattern previously written in. The mapping function is:

$$f(DE) = \begin{cases} f_1(DE) = \{D1\}_{1,\ldots,m} & \text{for } DE = 1 \\ f_0(DE) = \{D0\}_{1,\ldots,m} & \text{for } DE = 0 \end{cases}$$

wherein $f_0$ and $f_1 = \overline{f_0}$ represent the functions prescribed by the module design.

Depending on the module design and, thus manufacturer-dependent, every memory module comprises exactly one mapping function f (DE), proceeding from the test datum, this mapping function generating a defined bit pattern within a cell group. The bit pattern can merely be negated for testing the memory module. However, the memory module is not adequately tested for bit pattern sensitivity with the respectively two bit patterns available. Many errors occur at malfunction cells only when their support field comprises a specific bit pattern. A number of topological tests exist for the recognition of such errors that are based on the interaction of at least two cells, these topological tests working with various test patterns. Topological tests, however, cannot be executed in unlimited fashion in the previous multi-bit test mode because the test patterns needed therefor cannot be generated in the cell fields. They can only be executed in the individual bit mode in mega-bit modules. This, however, is not expedient because the test cycle times are dependent on the type of test and on the storage capacity of the memory module are thus disproportionately high. Test cycle times of up to several hundred hours can occur.

SUMMARY OF THE INVENTION

It is therefore an object of the invention to specify a method and an arrangement for the implementation of this method by which an arbitrary test pattern can be generated and, thus, topological tests having shortened test times can be enabled with memory modules of the mega-bit generation in a multi-bit test mode within a cell group.

The present invention achieves this object for the method. What is essential is that a fixed, design-dependent, m-dimensional imaging of a 1-bit datum onto the cells of a cell group of the cell field no longer takes place; rather, a test word provided with arbitrary individual data and having individual bits permanently allocated to the individual cells of a cell group is first formed, this being subsequently mapped onto the cells of a cell group of the cell field.

For the implementation of the method, the arrangement of the memory modules at the input of the cell field comprises at least one additional test word register having a bit width corresponding to the plurality of a cell group to be tested. A comparison logic in which the data information read out from the cell field are compared to the data information of the test word originally read-in is situated at the output of the cell field.

For controlling the read-in or write-in of a test word into the test word register or, respectively, of a test word into the cell field, an advantageous improvement of the invention utilizes an address line which becomes free as a result of the address space to be addressed having been reduced because of the multi-bit test mode, utilizing this in order to eliminate a relatively involved counter arrangement which counts the m data information of a test word during read-in.

BRIEF DESCRIPTION OF THE DRAWING

Reference will now be made to the accompanying drawing in which.

DESCRIPTION OF THE PREFERRED EMBODIMENT

Figure 1:
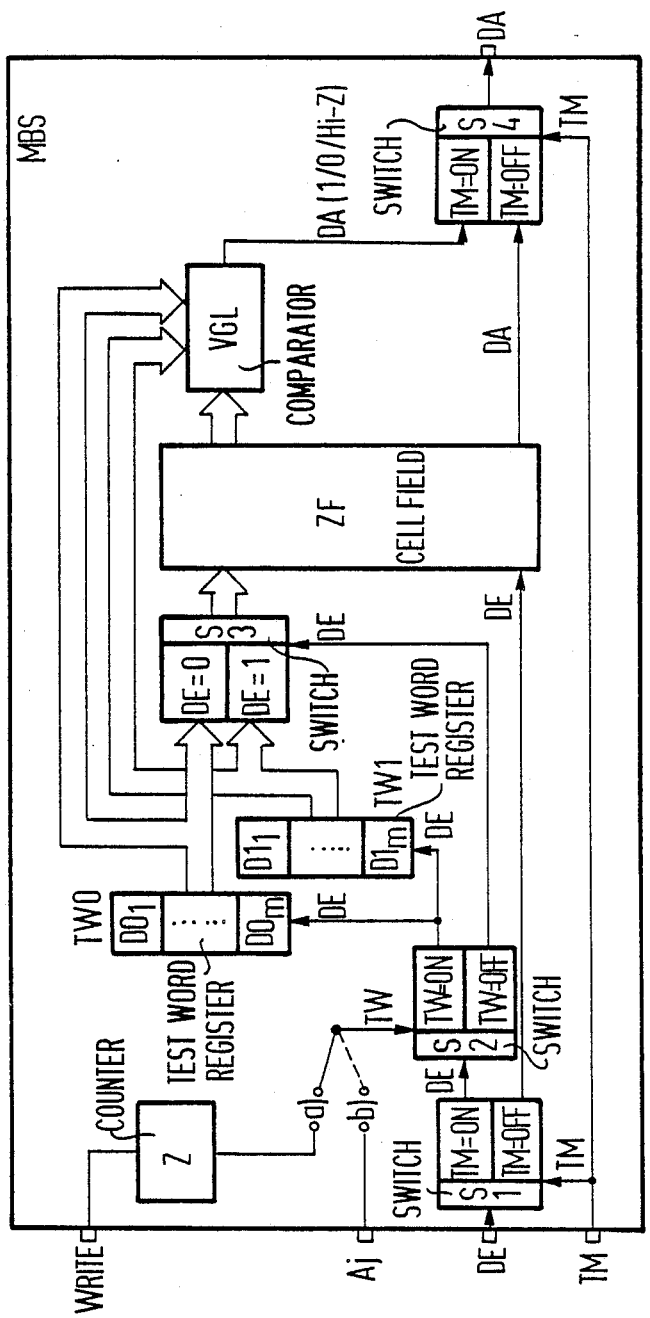
FIG. 1 illustrates the fundamental structure of a memory module of the mega-bit generation according to the invention.

In additon to the switches S1 and S4 already present and in addition to the cell field ZF, the mega-bit memory module MBS shown in the figure comprises two additional test word registers for the test words TW0 and TW1 preceding the cell field ZF, and also comprises a comparison logic VGL following the cell field ZF. For example, the test word registers can be constructed of shift registers or of parallel registers.

The switch S3 is arranged between ZF and the test word registers, this switch S3 selecting the content of one of the test words TW0 or TW1 during the test in the multi-bit mode via the data information DE and forwarding it into the cell field ZF.

The mapping function is:

$$f(DE) = \begin{cases} f_1(DE) = TW1 = \{D1\}_{1,\ldots,m} \text{ for } DE = 1 \\ f_0(DE) = TW0 = \{D0\}_{1,\ldots,m} \text{ for } DE = 0 \end{cases}$$

whereby $f_0 = \overline{f_1}$ now need not necessarily apply. $f_0$ and $f_1$ are now no longer rigidly prescribed but are freely selectable from the outside by programming.

The switch S2 is connected from writing the test word registers to produce the selection signal DE for selecting one of the test words TW0 or TW1. The time of switching of S2 is controlled with the signal TW which is derived either from a counter Z having a counter cycle $2 \times m$ count units (case a) or from an address line $A_j$ (case b). The address line $A_j$ is an address line that is not used in the multi-bit test mode. It is assumed for the exemplary embodiment that the counter Z is integrated into the memory module.

When the multi-bit test mode is switched off with the signal TM=OFF, the data information DE arriving at the data input at the memory module are forwarded directly to the cell field ZF via the switch S1 and are written into the cell field ZF at a location specified by an address. When the content of a cell of the cell field ZF is read out, the cell information DA proceeds via the switch S4 directly to the data output of the memory module MBS.

For testing the memory module MBS, the signal TM=ON switches the memory module MBS into the multi-bit test mode. Further the turn-on of the test mode informs the counter Z of the memory module MBS that the incoming data information of the following $2 \times m$ write cycles (identified by low level pulses of the signal WRITE) are to be written into the test word register. To that end, the counter Z generates the control signal TW=ON whcih causes the swtich S2 to switch on the write-in into the test word register. The first m data information DE at the data input of the memory module MBS which are counted by the counter Z proceed via the switches S1 and S2 into the first test word register and form the test word TWO there. The second m data information DE, under control of the switch S2, are written into the second test word register and form the test word TW1. The relationship TW0=$\overline{TW1}$ need not necessarily apply to the test words TW0 and TW1. Simultaneously with the generating of two test words TW0 and TW1, the comparison logic VGL is supplied with the test words TW0 and TW1.

After $2 \times m$ data information DE have been read in, the counter Z sets the control line TW=OFF. In response thereto, the switch S2 causesone of the test words TW0 or TW1 to be mapped onto an m-dimensional cell group of the cell field ZF at the next write cycle. The test word can thereby be mapped onto one cell group or, preferably, can be successively mapped onto a plurality of cell groups. On the basis of the datum DE externally applied to the module, a switch can be randomly undertaken between the test word TW0 and TW1 during the mapping event. In the mapping of a test word TW0 or TW1 onto the individual cells of an m-dimensional cell group, the content of exactly one bit place of the test word is respectively mapped onto one cell of the cell group. The greatest variety of bit patterns are generated in this way in the cell field ZF at a prescribed location, with the appertaining support field being generated by the selection of specific test words TW0 and TW1.

Upon read-out, the cell contents of an m-dimensional cell group of the cell field ZF are subjected to inverse mapping in that the comparison logic VGL compares them to the test words TW0 and TW1. Given a positive course of the comparison, the result of the inverse function is output at the data output corresponding to 0 or 1, i.e. dependent on whether the bit pattern coincides with TW0 or TW1, whereas the data output is switched into the Hi condition or tri-state condition instead when a negaative comparision is realized.

A malfunctioning cell, however, could also be indicated in that the output level of the data output of the memory module MBS is 0 or 1 upon read-out of cell contents of error-free cells, whereas the level when reading out a cell group comprising at least one but at most m−1 malfunctioning cells correspondingly assumes the inverse value. The function of the comparison logic VGL is:

$$f^{-1}(\{DA\}_{1,\ldots,m}) = \begin{cases} 0 \text{ for } DA_{1,\ldots,m} = TW0 \\ 1 \text{ for } DA_{1,\ldots,m} = TW1 \\ \text{Tristate, Hi--Z otherwise} \end{cases}$$

A simplified embodiment of the circuit arrangement comprises only one additional test word register for a test word TW0, whose contents are mapped onto the cells of a cell group not negated (TW0) or negated ($\overline{TW0}$), dependent on the data information DE given a fixed individual allocation of the bit places of the test word to the m cells of a cell group. For the rest, the operation of this circuit arrangement is analogous to that of the circuit arrangement comprising two additional test word registers.

It will be apparent that various modifications and/or additions may be made in the apparatus of the invention without departing from the essential features of novelty involved, which are intended to be defined and secured by the appended claims.

We claim:

1. A method for testing mega-bit memory modules in a multi-bit test mode with arbitrary test patterns, whereby at reading in a 1-bit datum the 1-bit datum is simultaneously mapped onto a cell group of m cells of the memory cell field described by the m-dimensional function f(DE)=$\{DE\}_{1,\ldots,m}$ with DE$\epsilon\{0,1\}$ and whereby at reading out the cell contents of such a cell group the cell group is inversely mapped by the m-dimensional inverse function $f^{-1}(\{DA\}_{1,\ldots,m})$=DA with DA$\epsilon\{0,1\}$ to get the original datum,
   reading in m data information (DE) bits individually into the mega-bit memory module (MBS) and combining such bits into an m-dimensional test word (TW0) in a test word register,
   allocating the bit places of a test word (TW0) to the cells of an m-dimensional cell group, and
   subsequently mapping the test word (TW0) or the negated test word ($\overline{TW0}$) onto a cell group or onto a plurality of cell groups of the cell field (ZF).

2. The method according to claim 1, including the step of mapping at least two mutually independent test words (TW0 and TW1) which are randomly selectable on the basis of the read-in data information (DE), onto the cell group for the cell field (ZF).

3. The method according to claim 1 or 2, including the step of supplying the test words (TW0 and/or TW1) to a comparison logic (VGL) which compares the actual cell contents of a cell group to the test words (TW0 or TW1) originally written in and, in response to the comparison, generating a good or bad signal.

4. In an arrangement for the testing of a mega-bit memory module having a data input, a data output, a control input for the adjustment of a test mode and a cell field (ZF) divided in cell groups, the combination comprising:

at least one test word register (e.g. TW0) having a control input and plurality of outputs, said outputs corresponding to m-bit locations for a m-dimensional testword for the cell field (ZF), said testword register having each of its bit locations allocated to a prescribed cell within a cell group of said mega-bit memory module, a first switch (S1), having an input for data, an input for control signals, and two outputs, said input for data being connected with said data input, and the input for control signals being connected with said control input of said mega-bit memory module; said first switch being responsive to the signals at its input for control signals to connect an output of said switch (S1) respectively with an input for data of a second switch (S2) or with a first input of the cell field (ZF), said second switch (S2) having an input for control signals and two outputs, said first output of the second switch (S2) being connected with the control inputs of the testword register and the second output of the second switch (S2) being connected with an input for control signals of a third signal (S3) which has an output and which has an input for each testword register, the output of said third switch (S3) being connected with a second input of the said cell field (ZF), a comparison logic unit (VGL), the outputs of said testword register and a first output of the cell field (ZF) being connected as inputs to said comparison logic unit (VGL), a second output of the cell field (ZF) being connected with a first input of a fourth switch (S4), and an output of the comparison logic unit (VGL) being connected with a second input of said fourth switch (S4), said fourth switch (S4) having an input for control signals connected with the control input of said multi-bit memory module and the output of said fourth switch (S4) being connected with the data output of said multi-bit memory module.

5. Apparatus according to claim 4, including a counter (Z) having a counter cycle of m steps per testword register, said counter having an input for a writing signal and an output connected with the input for control signals of said second switch (S2).

6. Apparatus according to claim 4, including a further control input (Aj) for said multi-bit memory module, said further control input being connected with the input for control signals of said second switch (S2).

* * * * *